United States Patent [19]
Cohen

[11] Patent Number: 5,289,166
[45] Date of Patent: Feb. 22, 1994

[54] VOLTAGE DETECTOR

[75] Inventor: Isaac Cohen, Dix Hills, N.Y.

[73] Assignee: Lambda Electronics Inc., Melville, N.Y.

[21] Appl. No.: 771,640

[22] Filed: Oct. 4, 1991

[51] Int. Cl.$^5$ ............................................. G08B 21/00
[52] U.S. Cl. ................................... 340/661; 340/660; 324/140 D; 307/354
[58] Field of Search ............... 340/660, 661, 662, 663, 340/635; 324/140 D, 119; 361/90, 91, 92; 307/350, 351, 354

[56] References Cited

U.S. PATENT DOCUMENTS

| | | | |
|---|---|---|---|
| 4,754,407 | 6/1988 | Nolan | 340/661 |
| 4,980,791 | 12/1990 | Krack et al. | 340/663 |
| 4,988,943 | 1/1991 | Bush | 324/140 D |
| 5,119,073 | 6/1992 | Nelson et al. | 340/661 |

OTHER PUBLICATIONS

Hiroshi Yamasita, "Uninterruptible Power Supply Systems in NTT", IEEE 1990, pp. 412–418.

*Primary Examiner*—Jeffrey Wofsass
*Attorney, Agent, or Firm*—Morgan & Finnegan

[57] ABSTRACT

A voltage detector to sense deviations of instantaneous value of a monitored voltage from a desired value is provided. The system includes a reference voltage source for providing a reference voltage. A divider responsive to the monitored voltage and the reference voltage divides the reference voltage by the monitored voltage. Thereafter a window comparator responsive to an output of the divider produces an indication when the output of the divider is either higher than some predetermined high value or lower than some predetermined low value.

11 Claims, 4 Drawing Sheets

VOLTAGE DETECTOR

BACKGROUND

In so-called standby uninterruptible power systems, it is essential that deviations of the AC line voltage outside the allowed band be detected quickly, ideally instantaneously, in order to transfer the protected load to an alternative power source in the shortest time possible.

Based on the above performance requirements, we can define the ideal AC power detector as follows: the detector should be responsive to the instantaneous voltage value rather than its average or RMS in order to allow fast response; the detector should be capable of detecting both positive and negative deviations of the monitored AC source; and the detector should be able to react very quickly for large errors and slowly for small errors. Such characteristics will allow the detector to ignore, if desired, irrelevant errors such as harmonic distortions and short term, small magnitude, voltage deviations.

In the prior systems, the requirements set forth above are approximately satisfied by circuits based on the assumption that the monitored voltage is sinusoidal. Consequently the monitored waveform value is sampled at one, two, or more points and a decision is made that the monitored voltage is within tolerance when the samples are within a certain range.

There are numerous variations of detector circuits employing this principle. A typical one is described by H. Yamashita in his paper "Uninterruptible Power Systems in NTT" (Proceedings in INTELEC 90, pp. 414–415, IEEE publication 3CH2928-0/90/000/0412). The waveforms relevant to the detector proposed by Yamashita appear in FIG. 1. As stated by Yamashita, the AC voltage 10 is rectified. The rectified voltage 20 is compared with a reference level 22, and a train Tv of pulses 24 is obtained. The width of pulse 24 is compared with the width of reference pulse 26 of train Tr. When commercial power failures occur, the width of pulse 24 Tv will be changed, and the detection circuit will then detect the voltage failure.

Inspection of this type of circuit reveals that it has some serious deficiencies. Referring to FIG. 2, it can be seen that a severely clipped waveform 25 will not be treated as a failure by the detector, while a small distortion 30 around the sampling point that may be inconsequential, particularly if it is a one time phenomenon, will cause an immediate failure detection.

In contrast to the foregoing, the voltage detector of this invention eliminates these deficiencies and others existing in the prior art. In addition it provides the capability of sensing phase and frequency deviations of the monitored voltage source.

SUMMARY AND OBJECT OF THE INVENTION

According to an aspect of the invention, in order to detect the deviations of an AC voltage from a desired value, a reference voltage equal to a desired value is provided. Thereafter, the reference voltage is divided by the monitored AC voltage by using a divider. Under normal conditions the actual value of the monitored AC voltage is equal to its desired value and the output of the divider will be equal to unity.

However, in the event of an AC voltage deviation from the desired voltage, the output of the divider deviates from unity in either direction. The output of the divider is then fed into a window comparator with a high and a low threshold voltage. The values of the threshold voltages will define the high and low values of the detector's range. Divider output values within the range produce a signal condition indicating acceptable operation, while those outside the range generate a signal condition indicating the need for corrective or remedial action.

In view of the foregoing, it is an object of the present invention to provide a voltage detector with accurate performance characteristics.

It is another object of the invention to provide a digitally programmable voltage detector wherein the system parameters can be easily defined according to the user's requirements.

It is still a further object of the invention to provide a voltage detector which is insensitive to insignificant deviations and which is highly sensitive to significant deviations according to desired system specifications.

It is still another object of the invention to provide a voltage detector which is capable of sensing frequency and/or phase deviations in the monitored voltage.

These and other objectives are accomplished by the present voltage detector invention which consists in the novel parts, constructions, arrangements, combinations, steps, and improvements herein shown and described.

BRIEF DESCRIPTION OF THE DRAWINGS

The accompanying drawings, referred to herein and constituting a part hereof, illustrate preferred embodiments of the method and system of the present invention, and together with the description serve to explain the principles of the invention in which.

DETAILED DESCRIPTION OF THE PREFERRED EMBODIMENTS

The voltage detector consists in its simplest embodiment of a divider and a window comparator. For purposes of clarity it is assumed that voltages are sinusoidal AC voltages. However, as will be apparent, the system is able to operate with any kind of voltage.

Figure 1:
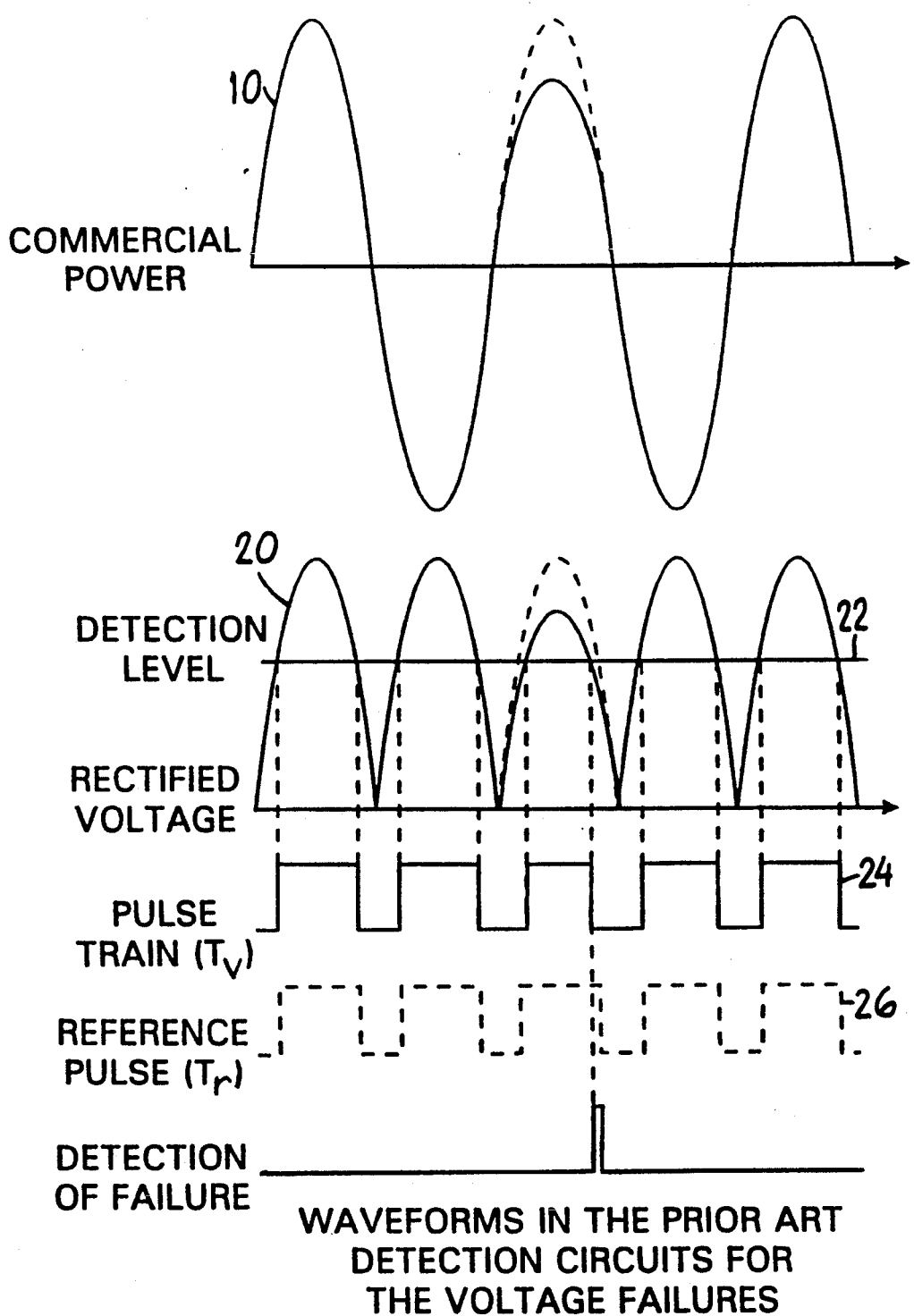
FIG. 1 is a wave form diagram depicting the operation of a prior art voltage detection technique.
Figure 2:
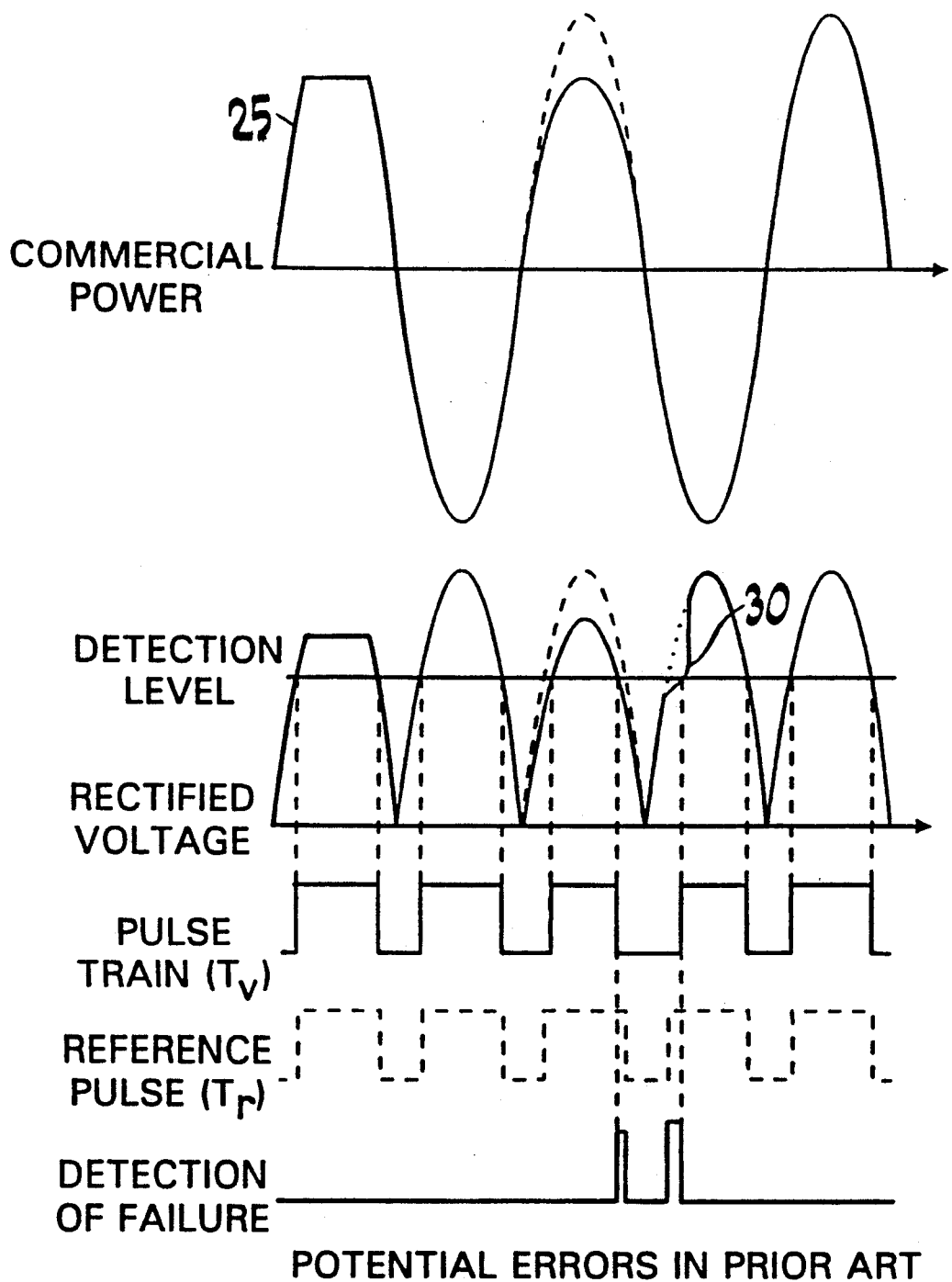
FIG. 2 is a diagrammatic example of the wave form of an A.C. signal that can cause failure in prior art A.C. detectors.
Figure 3:
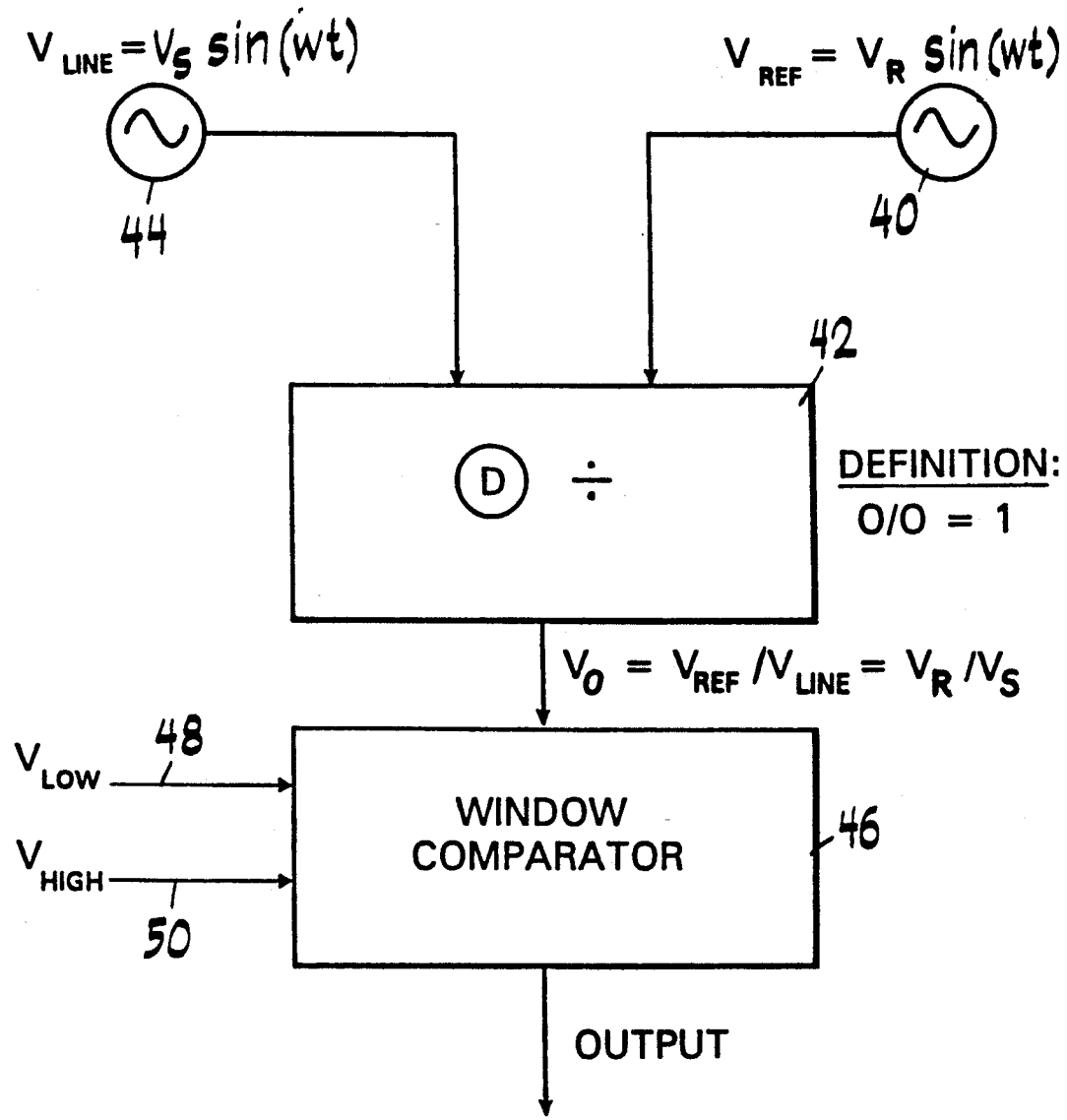
FIG. 3. is a block diagram of a digital implementation of the invention.

Referring to FIG. 3, there is shown a system for detecting deviations of an AC voltage $V_{LINE}$ from a desired reference value $V_R$ Sin wt. A reference voltage generator 40 is connected to a divider 42. Line voltage source 44 is also connected to the divider 42. The output of the divider is connected to a window comparator 46. The threshold levels of the window comparator are provided by $V_{LOW}$ 48 and $V_{HIGH}$ 50.

Reference voltage generator 40 provides a desired reference voltage $V_{REF}$ to the divider. As an example, the desired voltage could be defined as $V_{REF} = V_R$ Sin wt. Line voltage source 44 represents the voltage that needs to be monitored. As an example the line voltage source may be defined as $V_{LINE} = V_s$ Sin wt.

In order to measure the deviations of the AC voltage $V_{LINE}$ from the desired voltage $V_{REF}$, divider 42 divides the reference voltage $V_{REF}$ by the monitored AC voltage $V_{LINE}$. This operation will yield a voltage $V_o$ given by:

$$V_o = \frac{V_{REF}}{V_{LINE}} = \frac{V_R \sin wt}{V_S \sin wt} = \frac{V_R}{V_S} \quad (1)$$

It must be emphasized that since the division of zero by zero is mathematically undefined, a constraint to the divider 42 is necessary to force the output of the divider 42 to assume unity value for cases when both the numerator and the denominator are zero. This will happen every time the waveforms cross zero value.

$$V_o \text{ of } \frac{0}{0} = 1 \quad (2)$$

Evidently, in case the denominator value equals zero while the numerator has a value different from zero, the output of the divider will saturate to high or low values dictated by actual circuit parameters.

Under nominal conditions, $V_s = V_R$ and therefore the output of divider 42 will be a constant unity voltage. Thus:

$$V_o = 1 \quad (3)$$

It is obvious now that any deviation of the monitored voltage from its desired value will cause an instantaneous deviation of the divider 42 output from the unity value. This deviation can go either up or down, depending on the change of $V_{LINE}$ and can be detected by the window comparator. Accordingly, the value of the threshold voltages $V_{HIGH}$ and $V_{LOW}$ define the high and low values of the detector's range.

The above described embodiment will be particularly useful in a digital implementation, where the necessary four quadrant division and the constraints can be easily programmed.

Figure 4:
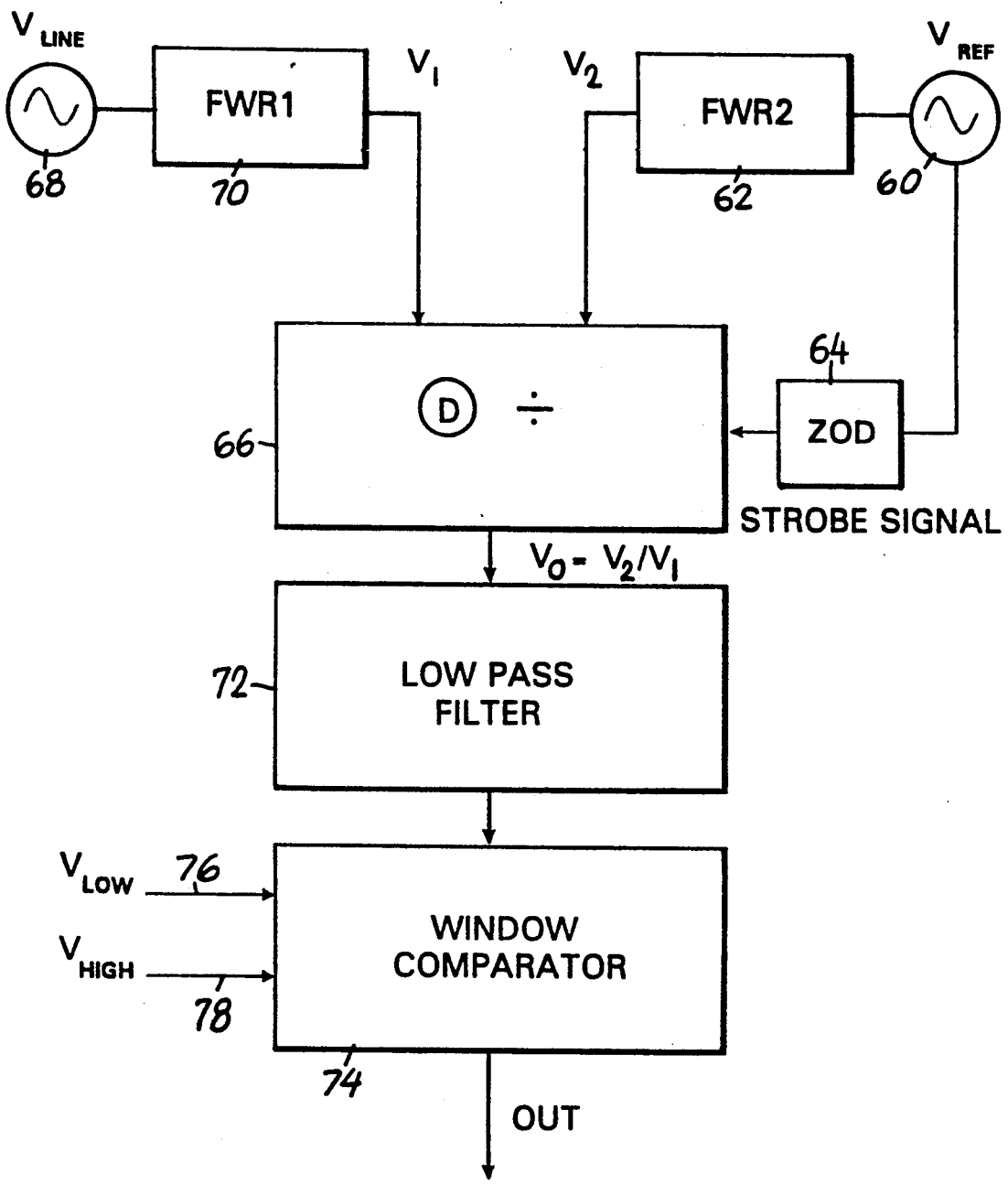
FIG. 4 is a block diagram of an analog implementation of the invention.

For an analog implementation the embodiment of FIG. 4 may be more useful. As illustrated in FIG. 4, the output of reference voltage generator 60 is connected to the input of full wave rectifier 62. The output of rectifier 62 is connected to a one quadrant divider 66. The output of the reference voltage generator is also connected to the input of zero crossing detector 64. The output of the zero crossing detector 64 is also connected to the divider. An example of a divider is the Model RC4200 multiplier/divider by Raytheon.

Line voltage source 68 is connected to full wave rectifier 70. The output of the full wave rectifier 70 is connected to the divider 66. The output of the divider is fed to a low pass filter 72. Output of the low pass filter is in turn connected to a window comparator 74. An example of a comparator is LN339 by National Semiconductor. Two comparators may be designed such that they can operate as as a window comparator. The threshold levels of the window comparator are provided by $V_{LOW}$ at input 76 and $V_{HIGH}$ at input 78.

in the illustrative embodiment, the output of the full wave rectifier 70 can be defined as $$V1 = |V_s \sin wt| \quad (4)$$

and

The output of the full wave rectifier 62 can be defined as $$V2 = |V_R \sin wt| \quad (5)$$

These voltages are then applied to the one quadrant divider 66 since both signals are always positive (or zero). In order to avoid the undefined situation of division by zero, the zero crossing detector 64 can be used to generate a strobe signal that will force the output of the divider to assume a desired value for a narrow interval around the zero crossing of the reference voltage. It can be appreciated that a comparator can be implemented to function as a zero crossing detector. Finally, by filtering the output of the divider 66 through the low pass filter 72, the reaction time of the detector to a disturbance in the monitored voltage will become slow for small durations while remaining fast for large deviations.

This property can be intuitively understood by considering that if the instantaneous value of the monitored voltage $V_{LINE}$ drops to zero, the output of the divider 66 will assume a theoretically infinite value, limited in actuality by circuit parameters, rendering any delay caused by the low pass filter 72 negligible. As a result window comparator 74 will detect a deviation almost instantly. In case of a small decrease of the voltage $V_{LINE}$ relative to $V_{REF}$, the output voltage of the divider will deviate from its normal (unity) value by only a small amount and the delay introduced by the low pass filter will be significant. This will prevent the window comparator 74 from detecting a deviation for a certain period of time. If the deviating condition continues beyond that certain period of time, it will be detected. Consequently, judicious selection of the low pass filter's parameter will allow the detector to be insensitive to deviations in the monitored voltage that may be considered insignificant, without appreciably affecting the response time of the detector to large deviations.

It can easily be seen that in case the frequency and/or phase of the monitored voltage varies from that of the reference voltage, both detector embodiments described above will generate a signal indicating failures. This property further enhances the versatility and usefulness of this detector.

The invention in its broader aspects is not limited to the specific embodiments shown and described herein, but departure may be made therefrom within the scope of the accompanying claim without departing from the principles of the invention and without sacrificing its chief advantage.

What is claimed is:

1. A voltage detector to sense deviations of instantaneous value of monitored AC voltage from pre-determined desired values, comprising:

a reference AC voltage source independent from said monitored AC voltage for providing a reference AC voltage having said pre-determined desired values;

divider means responsive to said monitored AC voltage and said reference AC voltage for dividing said reference voltage by said monitored voltage; and window comparator means responsive to an output of said divider for producing an indication when the output of said divider means is either higher than some predetermined high value or lower than some predetermined low value, said window comparator means providing an output in response to an instantaneous deviation of said monitored AC voltage from said desired values.

2. A voltage detector of claim 1 wherein said monitored voltage is full wave rectified prior to being divided by said divider means.

3. A voltage detector of claim 1 wherein said reference voltage is full wave rectified prior to being divided by said divider means.

4. A voltage detector of claim 1 wherein said reference voltage and said monitored voltage are full wave rectified prior to being divided by said divider means.

5. A voltage detector of claims 1 or 2, or 3 or 4 where the output of the said divider, means is processed through a low pass filter means prior to being fed to said window comparator means.

6. A voltage detector according to claim 5 wherein said reference voltage source is coupled to a zero crossing detector, said zero crossing detector providing a strobe signal to said divider means such that said divider means provides a predetermined output when said reference voltage source is essentially zero.

7. A voltage detector according to claim 5 wherein said divider means provides a predetermined output when said reference voltage is essentially zero.

8. A voltage detector according to claim 1 wherein said reference voltage source, said divider means, and said window comparator means are capable of being digitally programmable.

9. A method of sensing deviation of instantaneous values of a monitored AC signal from a predetermined desired AC signal, comprising the steps of:
providing a reference AC signal independent from said monitored signal; dividing, said reference signal by said monitored voltage to obtain a division signal; and
producing an indication when said division signal is either higher than some predetermined high value, or lower than some predetermined low value, said indication being produced whenever said instantaneous value of said monitored signal deviates from an instantaneous value of said predetermined desired AC signal.

10. A voltage detector of claim 1 wherein said divider means provides an output associated with a phase deviation of said monitored voltage from said reference voltage.

11. A voltage detector of claim 1 wherein said divider means provides an output associated with a frequency deviation of said monitored voltage from said reference voltage.

* * * * *